United States Patent
Ku et al.

(10) Patent No.: US 9,134,609 B2
(45) Date of Patent: Sep. 15, 2015

(54) PHOTO-CURABLE AND THERMO-CURABLE RESIN COMPOSTION, AND DRY FILM SOLDER RESIST

(71) Applicant: LG CHEM, LTD., Seoul (KR)

(72) Inventors: Se-Jin Ku, Daejeon (KR); Byung-Ju Choi, Daejeon (KR); Woo-Jae Jeong, Daejeon (KR); Bo-Yun Choi, Daejeon (KR); Kwang Joo Lee, Daejeon (KR); Min-Su Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/245,184

(22) Filed: Apr. 4, 2014

(65) Prior Publication Data

US 2014/0221519 A1    Aug. 7, 2014

Related U.S. Application Data

(63) Continuation of application No. PCT/KR2013/001339, filed on Feb. 20, 2013.

(30) Foreign Application Priority Data

Feb. 20, 2012  (KR) .................. 10-2012-0017125
Mar. 19, 2012  (KR) .................. 10-2012-0027873
Jul. 30, 2012  (KR) .................. 10-2012-0083106
Jan. 24, 2013  (KR) .................. 10-2013-0008252
Feb. 19, 2013  (KR) .................. 10-2013-0017683

(51) Int. Cl.

| | |
|---|---|
| C08F 2/50 | (2006.01) |
| B29C 71/04 | (2006.01) |
| A61L 2/08 | (2006.01) |
| A61L 24/00 | (2006.01) |
| C08F 2/46 | (2006.01) |
| C08G 61/04 | (2006.01) |
| G03F 7/029 | (2006.01) |
| C09D 179/04 | (2006.01) |
| C08G 73/06 | (2006.01) |
| G03F 7/032 | (2006.01) |

(52) U.S. Cl.
CPC ............. *G03F 7/029* (2013.01); *C08G 73/065* (2013.01); *C08G 73/0644* (2013.01); *C08G 73/0655* (2013.01); *C09D 179/04* (2013.01); *G03F 7/032* (2013.01)

(58) Field of Classification Search
CPC ...................................... C08G 73/00
USPC ................ 522/64, 6, 71, 189, 184, 1; 520/1
See application file for complete search history.

(56) References Cited

U.S. PATENT DOCUMENTS

| | | | |
|---|---|---|---|
| 6,893,784 B2 | 5/2005 | Kohiyama et al. | |
| 7,038,328 B2 | 5/2006 | Enomoto et al. | |
| 8,742,568 B2 * | 6/2014 | Kondo et al. | ................ 257/702 |
| 2003/0017414 A1 | 1/2003 | Ishii et al. | |
| 2011/0269866 A1 | 11/2011 | Jeong et al. | |
| 2012/0070780 A1 * | 3/2012 | Choi et al. | ................ 430/280.1 |
| 2012/0097435 A1 | 4/2012 | Goshima et al. | |
| 2012/0301824 A1 | 11/2012 | Yoshida et al. | |
| 2012/0301825 A1 | 11/2012 | Yoshida et al. | |
| 2013/0063917 A1 | 3/2013 | Choi et al. | |
| 2014/0083567 A1 | 3/2014 | Hamagawa et al. | |

FOREIGN PATENT DOCUMENTS

| | | | |
|---|---|---|---|
| JP | 8-188702 A | 7/1996 | |
| JP | 2001163972 A | 6/2001 | |
| JP | 2002-357900 A | 12/2002 | |
| JP | 2003131373 A | 5/2003 | |
| JP | 2006-518774 A | 8/2006 | |
| JP | 3964326 B2 | 8/2007 | |
| JP | 4273894 B2 | 6/2009 | |
| JP | 2010260902 A | 11/2010 | |
| JP | 2010282067 A | 12/2010 | |
| JP | 2011-164305 A | 8/2011 | |
| JP | 2011-164306 A | 8/2011 | |
| JP | 2011-197269 A | 10/2011 | |
| JP | 4897932 B1 | 3/2012 | |
| KR | 20080005871 A | 1/2008 | |
| KR | 20100035106 A | 4/2010 | |
| KR | 101011841 B1 | 1/2011 | |
| KR | 20110106237 A | 9/2011 | |
| KR | 20110128135 A | 11/2011 | |
| TW | 201142499 A | 12/2011 | |
| WO | 2011/018128 | * 9/2011 | |
| WO | 2012-018126 A | 2/2012 | |

OTHER PUBLICATIONS

International Search Report from PCT/KR2013/001339, dated May 30, 2013, 5 pages.

\* cited by examiner

*Primary Examiner* — Ling Choi
*Assistant Examiner* — Jessica E Whiteley
(74) *Attorney, Agent, or Firm* — Rothwell, Figg, Ernst & Manbeck, P.C.

(57) ABSTRACT

The present invention relates to a photo-curable and thermo-curable resin composition that can provide a dry film solder resist having a higher glass transition temperature and improved heat resistance reliability, and the dry film solder resist. Said resin composition may include an acid-modified oligomer including an iminocarbonate-based compound having a carboxy group (—COOH) and a photo-curable unsaturated functional group, a photo-polymerizable monomer having two or more photo-curable unsaturated functional groups, a thermo-curable binder having a thermo-curable functional group, and a photo-initiator.

25 Claims, No Drawings

PHOTO-CURABLE AND THERMO-CURABLE RESIN COMPOSTION, AND DRY FILM SOLDER RESIST

CROSS REFERENCE TO RELATED APPLICATION(S)

This application is a continuation of International Application PCT/KR2013/001339, filed on Feb. 20, 2013, which claims under 35 U.S.C §119 priority to and the benefit of Korean Patent Application No. 10-2012-0017125, filed Feb. 20, 2012, Korean Patent Application No. 10-2012-0027873, filed Mar. 19, 2012, Korean Patent Application No. 10-2012-0083106, filed Jul. 30, 2012, Korean Patent Application No. 10-2013-0008252, filed Jan. 24, 2013, and Korean Patent Application No. 10-2013-0017683, filed Feb. 19, 2013, the disclosures of which are incorporated herein by reference in their entireties

TECHNICAL FIELD

The present invention relates to a photo-curable and thermo-curable resin composition and a dry film solder resist ("DFSR" below). More specifically, the present invention relates to a photo-curable and thermo-curable resin composition that can provide a DFSR having a lower coefficient of thermal expansion (CTE) and improved heat resistance reliability, and the DFSR.

BACKGROUND OF THE ART

As a variety of electronic devices are miniaturized and become light-weight, a photo-sensitive solder resist which can form minute opening patterns is being used in a printed circuit board, a semiconductor package board, a flexible circuit board, etc.

The semiconductor package product is a complex material consisting of non-conductors such as epoxy molding or solder resist, semiconductors such as chip die and conductors such as board circuit patterns, and several processes accompanying severe heat shock conditions should be performed in order to prepare it. However, the problems of dimensional instability and a warpage phenomena appear due to different coefficients of thermal expansion (CTE) of the non-conductor, semi-conductor, and conductor. Such phenomena may cause the position mismatch between the chip and board when the chip die and semiconductor board are connected by a solder ball or a gold wire, and a crack and rupture of a product due to the shear stress, which influences the lifetime of the product. As boards are recently becoming thinner, such problems of dimensional instability and the warpage phenomena become more serious. In order to solve the above, materials have been developed toward minimization of the CTE mismatch between the materials. Also, it is consistently needed to develop a solder resist having a lower coefficient of thermal expansion.

The previously known dry film-type solder resist has a coefficient of thermal expansion whose α1 (thermal expansion coefficient before Tg) is 45 to 70 ppm and α2 (thermal expansion coefficient after Tg) is 140 to 170 ppm.

As for the core among the current board materials, it has been reported that materials having a thermal expansion coefficient of 10 ppm or lower or even 5 ppm or lower were developed. However, the development of a material for a solder resist that can be used along with the core has not yet been reported.

Attempts have been made to lower the thermal expansion coefficient of the solder resist by increasing the content of a filler used. However, if the content of the filler is increased higher than a certain level, poor coating may be caused due to filler cohesion, and elongation may be reduced after coating and before curing to result in the problem of deteriorated workability.

The characteristics of a developing property, high resolution, an insulating property, an adhesive property, resistance to soldering heat, tolerance to gold plating, and the like are generally required of the solder resist. Particularly, for example, a crack-resistant property against a temperature cycle test (TCT) from −65° C. to 150° C., or a highly accelerated stress test (HAST) property to fine wiring, in addition to said characteristics, are required of the solder resist for a semiconductor package board.

Recently, a dry film-type solder resist superior in uniformity of film thickness, surface smoothness, and thin film-forming property has received attention as the solder resist. Such a dry film-type solder resist can impart the merits of simplification of a resist-forming process, or a reduction of solvent displacement in the resist-forming process, in addition to said characteristics.

In earlier days, a photo-curable and thermo-curable resin composition including a photo-polymerizable monomer such as a polyfunctional acrylate in company with an acid-modified oligomer, a photo-initiator, and a thermo-curable binder has been used for forming the solder resist. However, the solder resist formed from such a resin composition does not show a high glass transition temperature or sufficient heat-resistance reliability. Thus, it has disadvantages of not satisfying the PCT tolerance, TCT heat resistance, HAST tolerance to fine wiring, and the like that are required for the package board materials of semiconductor devices.

DETAILED DESCRIPTION OF THE INVENTION

Technical Objectives

The present invention provides a photo-curable and thermo-curable resin composition that can provide a DFSR having a higher glass transition temperature, a lower coefficient of thermal expansion (CTE), and improved heat resistance reliability. Further, the present invention provides a DFSR having a lower coefficient of thermal expansion (CTE) and improved heat resistance reliability.

Technical Solutions

The present invention provides a photo-curable and thermo-curable resin composition which includes an acid-modified oligomer including an iminocarbonate-based compound having a carboxy group (—COOH) and a photo-curable unsaturated functional group; a photo-polymerizable monomer having two or more photo-curable unsaturated functional groups; a thermo-curable binder having a thermo-curable functional group; and a photo-initiator.

The resin composition, when cured, may have a thermal expansion coefficient ($\alpha 1$) of 10 to 35 ppm before the glass transition temperature (Tg) and a thermal expansion coefficient ($\alpha 2$) of 150 ppm or lower after the glass transition temperature (Tg).

The iminocarbonate-based compound may be formed by reacting 1) a cyanate ester-based compound, 2) a dicarboxylic acid compound, and 3) a compound having a photo-curable unsaturated functional group and a hydroxy group or carboxy group.

The dicarboxylic acid compound may be an aliphatic dicarboxylic acid compound, an alicyclic dicarboxylic acid compound, or an aromatic dicarboxylic acid compound.

The dicarboxylic acid compound and the compound having a photo-curable unsaturated functional group and a hydroxy group or carboxy group may be used in a molar ratio of 2:8 to 8:2 to be reacted with the cyanate ester-based compound.

The dicarboxylic acid compound may include oxalic acid, malonic acid, succinic acid, glutaric acid, adipic acid, pimelic acid, suberic acid, azelaic acid, sebacic acid, norbornene dicarboxylic acid, a C5-C10 cycloalkane dicarboxylic acid, acid anhydrides thereof, or mixtures of two or more thereof.

The dicarboxylic acid compound may include phthalic acid, norbornene dicarboxylic acid, tetrahydrophthalic acid, succinic acid, imidazole dicarboxylic acid, pyridine dicarboxylic acid, acid anhydrides thereof, or mixtures of two or more thereof.

The compound having a photo-curable unsaturated functional group and a hydroxy group or carboxy group may include acrylic acid, methacrylic acid, cinnamic acid, butenoic acid, hexenoic acid, 2-allylphenol, hydroxystyrene, hydroxycyclohexane, 5-hydroxyl-p-naphthoquinone, or mixtures of two or more thereof.

The cyanate ester-based compound may include the bisphenol-based or novolak-based compound having a cyanate group (—OCN).

The acid-modified oligomer may include the iminocarbonate-based compound having the following Formula (1).

[Formula 1]

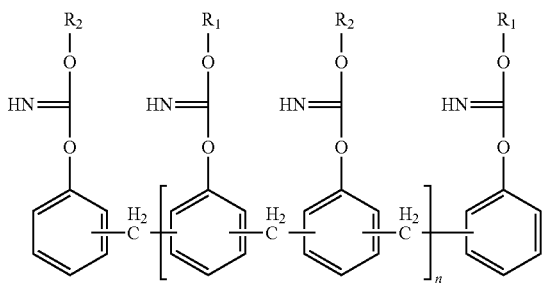

In the above Formula (1), n is an integer of 1 to 100, $R_1$ is a functional group derived from the compound having the photo-curable unsaturated functional group and the hydroxy group or carboxy group, and $R_2$ is a functional group derived from the dicarboxylic acid compound.

In the above Formula (1), $R_1$ may be

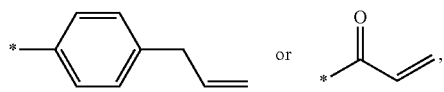

and $R_2$ may be

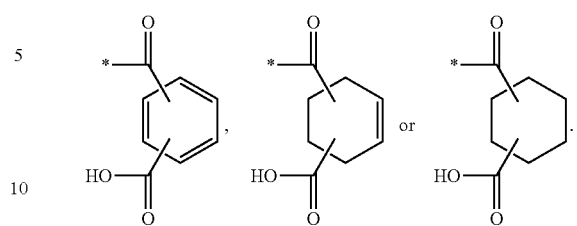

The above '*' means the point of binding.

The acid-modified oligomer may be contained in the amount of 15 to 75% by weight based on the total weight of the resin composition.

The photo-polymerizable monomer may include the acrylate-based compound having two or more photo-curable unsaturated functional groups.

The photo-polymerizable monomer may include an acrylate-based compound having a hydroxy group, a water-soluble acrylate-based compound, a polyester acrylate-based compound, a polyurethane acrylate-based compound, an epoxy acrylate-based compound, a caprolactone modified acrylate-based compound, or mixtures of two or more thereof.

The photo-polymerizable monomer may be contained in the amount of 5 to 30% by weight based on the total weight of the resin composition.

The photo-initiator may include one or more selected from the group consisting of benzoins and alkylethers thereof, acetophenones, anthraquinones, thioxanthones, ketals, benzophenones, α-aminoacetophenones, acylphosphine oxides, and oxime esters.

The photo-initiator may be contained in the amount of 0.5 to 20% by weight based on the total weight of the resin composition.

The thermo-curable functional group may be one or more selected from the group consisting of an epoxy group, an oxetanyl group, a cyclic ether group, and a cyclic thioether group.

The thermo-curable binder may be contained in the amount corresponding to 0.8 to 2.0 eq. with respect to 1 eq. of the carboxy group in the acid-modified oligomer.

The photo-curable and thermo-curable resin composition may further include a solvent, and one or more selected from the group consisting of a thermo-curable binder catalyst, a filler, a pigment, and an additive.

Furthermore, the present invention provides a dry film solder resist (DFSR) which includes a cured product of an acid-modified oligomer including an iminocarbonate-based compound having a carboxy group (—COOH) and a photo-curable unsaturated functional group, a photo-polymerizable monomer having two or more photo-curable unsaturated functional groups, and a thermo-curable binder having a thermo-curable functional group.

In this dry film solder resist (DFSR), the cured product may include a cross-linked structure wherein the carboxy group of the iminocarbonate-based compound and the thermo-curable functional group are crosslinked, a crosslinked structure wherein the iminocarbonate-based compound and the unsaturated functional group of the photo-polymerizable monomer are crosslinked with each other, and a crosslinked triazine structure of the following Formula (2) which is derived from the iminocarbonate-based compound.

[Formula 2]

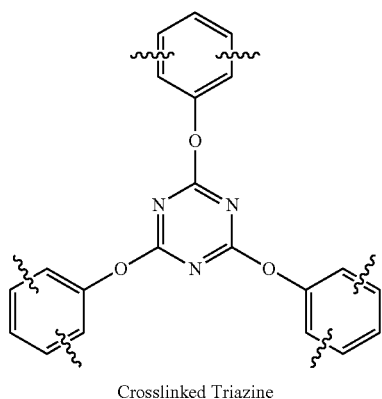

Crosslinked Triazine

By including the crosslinked triazine structure of Formula (2), the dry film solder resist (DFSR) provided from the above resin composition may show a higher glass transition temperature (Tg) and a lower thermal expansion coefficient than the earlier one using the acid-modified epoxy acrylate based on the novolac structure, thereby showing improved heat resistance reliability.

Thus, said DFSR can not only satisfy various physical properties such as PCT tolerance, TCT heat resistance, HAST tolerance to fine wiring, etc. that are required for the package board materials of semiconductor devices, but also reduce the poor quality and extend the product lifetime by decreasing the warpage phenomenon.

The dry film solder resist may have a thermal expansion coefficient ($\alpha 1$) of 10 to 35 ppm before the glass transition temperature (Tg) and a thermal expansion coefficient ($\alpha 2$) of 150 ppm or lower after the glass transition temperature (Tg).

The dry film solder resist may further include the photo-initiator that is dispersed in the cured product.

The dry film solder resist may have a glass transition temperature (Tg) of 130 to 180° C.

The dry film solder resist may be used in preparing the package board of a semiconductor device.

Advantageous Effect of the Invention

The resin composition of the present invention includes a specific acid-modified oligomer and thus can form a given crosslinked triazine structure in the cured product of the resin composition contained in the DFSR. Also, the resin composition includes the photo-polymerizable monomer having two or more photo-curable unsaturated functional groups and thus can make the final product DFSR have improved heat resistance reliability as well as the higher glass transition temperature (Tg) and the lower thermal expansion coefficient.

Therefore, the present invention can provide a DFSR that may show various physical properties such as excellent PCT tolerance, TCT heat resistance, HAST tolerance to fine wiring, etc., and decrease the warpage phenomenon. Such a DFSR can be advantageously used for preparing the package board of a semiconductor device.

DETAILS FOR PRACTICING THE INVENTION

Hereinafter, the photo-curable and thermo-curable resin composition and DFSR according to embodiments of the present invention will be explained in detail.

In one embodiment of the present invention, a photo-curable and thermo-curable resin composition which includes: an acid-modified oligomer including an iminocarbonate-based compound having a carboxy group (—COOH) and a photo-curable unsaturated functional group; a photo-polymerizable monomer having two or more photo-curable unsaturated functional groups; a thermo-curable binder having a thermo-curable functional group; and a photo-initiator is provided.

The resin composition includes the acid-modified oligomer, the photo-polymerizable monomer, the photo-initiator, and the thermo-curable binder, and particularly includes the iminocarbonate-based compound having a carboxy group and a photo-curable unsaturated functional group as the acid-modified oligomer.

DFSR can be formed following the steps below using the resin composition of the above embodiment. First, a film is formed by the resin composition and this film is laminated on a given board, and then the resin composition of the part on which DFSR will be formed is selectively exposed to light. Upon the exposure to light, the unsaturated functional group contained in the acid-modified oligomer, for example, an iminocarbonate-based compound, and the unsaturated functional group contained in the photo-polymerizable monomer are photo-cured to form crosslinks with each other, and as a result a crosslinked structure may be formed due to the photo-curing in the exposure part.

Then, if development is performed using an alkali solution, only the resin composition in the exposure part wherein a crosslinked structure is formed remains on the board, and the other resin composition in the non-exposure part is dissolved in the developing solution to be removed.

Then, the resin composition remaining on the board is treated by heat to proceed thermo-curing, thereby the carboxy group contained in the acid-modified oligomer, for example, the iminocarbonate-based compound, is reacted with the thermo-curable functional group contained in the thermo-curable binder to form crosslinks. As a result, a crosslinked structure may be formed due to the thermo-curing to form a DFSR in the desired part on the board.

since the resin composition includes the iminocarbonate-based compound as the acid-modified oligomer, the secondary crosslinked structure, for example, the crosslinked triazine structure as depicted by Formula (2) in the following Reaction Scheme (1), can be formed during the thermo-curing process. This is formed as the nitrogen atoms contained in the backbone of the iminocarbonate-based compound are combined by heat with each other to give the triazine ring.

[Reaction Scheme 1]

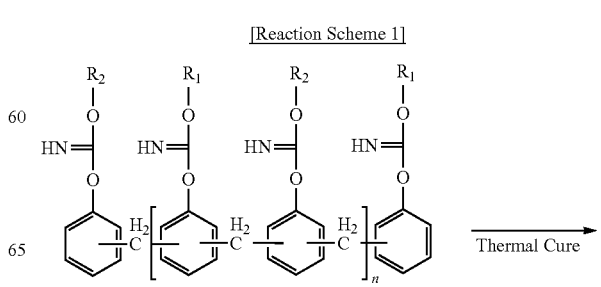

Thermal Cure

-continued

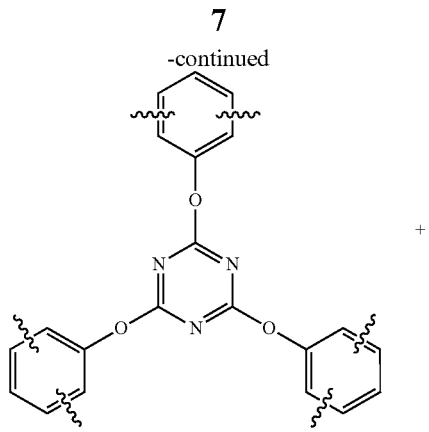

Crosslinked Triazine
compound(s) derived from R1 and R2

In the above Reaction Scheme (1), n is an integer of 1 to 100.

In the above Reaction Scheme (1), $R_1$ may be a functional group derived from the compound having a photo-curable unsaturated functional group and a hydroxy group or carboxy group, for example, a functional group derived from acrylic acid, methacrylic acid, butenoic acid, hexenoic acid, cinnamic acid, allylphenol, hydroxystyrene, hydroxycyclohexene, or a hydroxynaphthoquinone compound. The specific example of $R_1$ may be the functional group

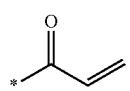

derived from acrylic acid or

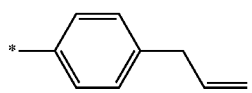

derived from allylphenol.

In the above Reaction Scheme (1), $R_2$ may be a functional group derived from the dicarboxylic acid compound, for example, a functional group derived from one or more compounds selected from the group consisting of oxalic acid, malonic acid, succinic acid, glutaric acid, adipic acid, pimelic acid, suberic acid, azelaic acid, sebacic acid, norbornene dicarboxylic acid, C5-C10-cycloalkane dicarboxylic acid, and acid anhydrides thereof, or one or more compounds selected from the group consisting of phthalic acid, norbornene dicarboxylic acid, tetrahydrophthalic acid, succinic acid, imidazole dicarboxylic acid, pyridine dicarboxylic acid, and acid anhydrides thereof.

The specific example of $R_2$ may be the functional group

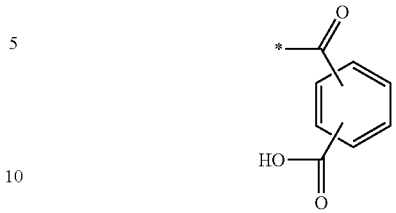

derived from phthalic acid,

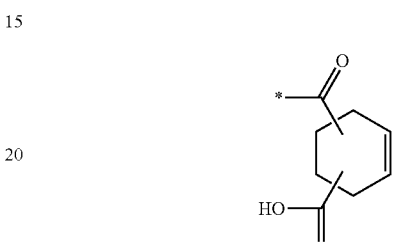

derived from tetrahydrophthalic acid, or

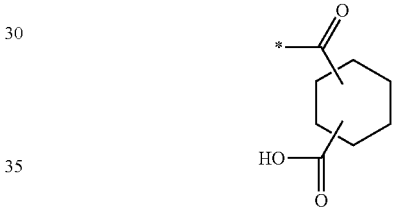

derived from cyclohexane.

In case that a DFSR is formed by using the above resin composition, since the cured product of the resin composition to give the DFSR includes the secondary crosslinked triazine structure in addition to the basic crosslinked structure (i.e., the one derived from the carboxy group of the acid-modified oligomer and the thermo-curable function group of the thermo-curable binder), the thermal expansion coefficient of DFSR may be lowered to 30 or lower for $\alpha1$ and to 150 or lower for $\alpha2$. Accordingly, the heat resistance reliability of DFSR may be improved, and the difference between thermal expansion coefficients of the semiconductor device and the package board material may be reduced to minimize the warpage problem.

Specifically, the resin composition, when cured, may have a thermal expansion coefficient ($\alpha1$) of 10 to 35 ppm, preferably 20 ppm or lower, before the glass transition temperature (Tg), and a thermal expansion coefficient ($\alpha2$) of 150 ppm or lower, or 120 ppm or lower, preferably 50 to 100 ppm, after the glass transition temperature (Tg).

Thus, the resin composition according to one embodiment of the present invention can provide a DFSR that shows the lower thermal expansion coefficient and improved heat resistance reliability and that can be advantageously used as the package board material for a semiconductor device.

Hereinafter, the resin composition according to one embodiment of the present invention is explained in more detail for each component.

Acid-modified Oligomer

The resin composition according to one embodiment of the present invention includes the iminocarbonate-based compound having a carboxy group (—COOH) and a photo-curable unsaturated functional group as the acid-modified oligomer. The acid-modified oligomer can crosslink with other components of the resin composition, namely the photo-polymerizable monomer and/or the thermo-curable binder, by a photo-curing process for allowing the formation of the DFSR, and it includes a carboxy group to give the resin composition in the non-exposure part the alkali developing property.

In particular, as the resin composition includes the iminocarbonate-based compound as the acid-modified oligomer, it can form the crosslinked triazine structure of Formula (2) in the cured product of the resin composition forming the DFSR. Thus, the resin composition of one embodiment is capable of preparing and providing the DFSR that has the higher glass transition temperature and improved heat resistance reliability.

The iminocarbonate-based compound may be formed by reacting a cyanate ester-based compound, a dicarboxylic acid compound, and a compound having a photo-curable unsaturated functional group and a hydroxy group or carboxy group. According to the use of such iminocarbonate-based compound, the crosslinked triazine structure may be preferably formed during the thermo-curing process, and a DFSR showing more excellent heat resistance reliability can be provided.

As the cyanate ester-based compound, a bisphenol-based or novolak-based compound having a cyanide group (—OCN), for example, the compound of following Formula (1a), may be used.

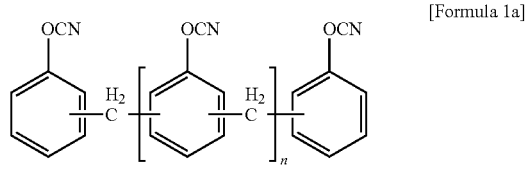

[Formula 1a]

In the above Formula (1a), n is an integer of 1 to 100.

Furthermore, the dicarboxylic acid compound that is reacted with the cyanate ester-based compound may be an aliphatic dicarboxylic acid compound, an alicyclic dicarboxylic acid compound, or an aromatic dicarboxylic acid compound.

Specifically, the dicarboxylic acid compound may include oxalic acid, malonic acid, succinic acid, glutaric acid, adipic acid, pimelic acid, suberic acid, azelaic acid, sebacic acid, norbornene dicarboxylic acid, a C5-C10 cycloalkane dicarboxylic acid, acid anhydrides thereof, or mixtures of two or more thereof.

Also, the dicarboxylic acid compound may include phthalic acid, norbornene dicarboxylic acid, tetrahydrophthalic acid, succinic acid, imidazole dicarboxylic acid, pyridine dicarboxylic acid, acid anhydrides thereof, or mixtures of two or more thereof.

The compound having a photo-curable unsaturated functional group and a hydroxy group or carboxy group may include acrylic acid, methacrylic acid, cinnamic acid, butenoic acid, hexenoic acid, 2-allylphenol, hydroxystyrene, hydroxycyclohexane, 5-hydroxyl-p-naphthoquinone, or mixtures of two or more thereof.

If the cyanate ester-based compound is reacted with the dicarboxylic acid compound and the compound having the photo-curable unsaturated functional group and the hydroxy group or carboxy group, the iminocarbonate-based compound may be preferably obtained as the acid-modified oligomer to which a carboxy group and a photo-curable unsaturated functional group are suitably introduced. Also, the iminocarbonate-based compound thus obtained suitably forms the crosslinked triazine structure during the thermo-curing process to make the formation and provision of the DFSR showing more improved heat resistance reliability possible.

The molar ratio of the carboxy group and the unsaturated functional group which are introduced to the iminocarbonate-based compound may be modified by controlling the molar ratio of the dicarboxylic acid compound and the compound having the photo-curable unsaturated functional group and the hydroxy group or carboxy group to be reacted with the cyanate ester-based compound. In order for the iminocarbonate-based compound to appropriately act as the acid-modified oligomer, the dicarboxylic acid compound and the compound having the photo-curable unsaturated functional group and the hydroxy group or carboxy group, that are to be reacted with the cyanate ester-based compound, may be used in a molar ratio of about 2:8 to 8:2. Accordingly, a carboxy group and an unsaturated functional group are suitably introduced to the iminocarbonate-based compound as the acid-modified oligomer, thereby the resin composition in the non-exposure part shows an excellent alkali-developing property, and the acid-modified oligomer forms a suitable crosslinked structure with the photo-polymerizable monomer and the thermo-curable binder to make the DFSR show excellent heat resistance, physical properties, etc.

On the other hand, as a more specific example, the acid-modified oligomer, particularly, the compound formed by reacting the cyanate ester-based compound with the dicarboxylic acid compound and the compound having more photo-curable unsaturated functional group and more hydroxy group or carboxy group may be the iminocarbonate-based compound of the following Formula (1).

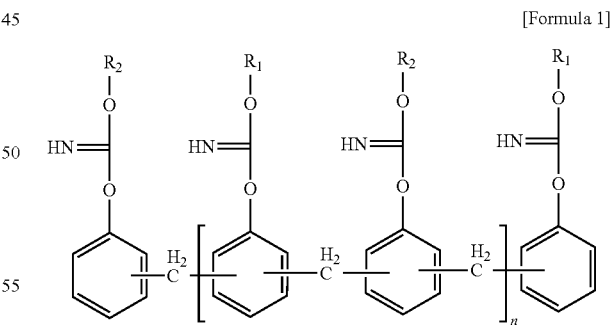

[Formula 1]

In the above Formula (1), n is an integer of 1 to 100.

In the above Formula (1), $R_1$ may be a functional group derived from the compound having the photo-curable unsaturated functional group and the hydroxy group or carboxy group, for example, a functional group derived from acrylic acid, methacrylic acid, butenoic acid, hexenoic acid, cinnamic acid, allylphenol, hydroxystyrene, hydroxycyclohexene, or a hydroxynaphthoquinone compound. The specific example of $R_1$ may be the functional group

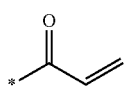

derived from acrylic acid or

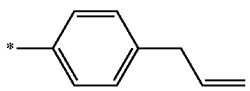

derived from allylphenol.

In the above Formula (1), $R_2$ may be a functional group derived from the dicarboxylic acid compound, for example, a functional group derived from one or more compounds selected from the group consisting of oxalic acid, malonic acid, succinic acid, glutaric acid, adipic acid, pimelic acid, suberic acid, azelaic acid, sebacic acid, norbornene dicarboxylic acid, a C5-C10 cycloalkane dicarboxylic acid, and acid anhydrides thereof, or one or more compounds selected from the group consisting of phthalic acid, norbornene dicarboxylic acid, tetrahydrophthalic acid, succinic acid, imidazole dicarboxylic acid, pyridine dicarboxylic acid, and acid anhydrides thereof, of which specific example may be the functional group

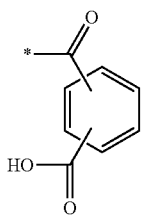

derived from phthalic acid,

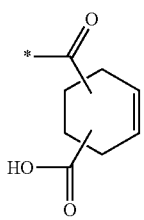

derived from tetrahydrophthalic acid, or

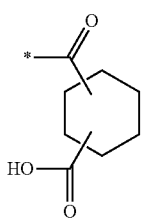

derived from cyclohexane.

The compound of Formula (1) may be obtained, for example, by reacting the compound of Formula (1a) with the dicarboxylic acid compound such as phthalic acid, cyclohexane dicarboxylic acid, tetrahydrophthalic acid, etc., and the compound having the unsaturated functional group and the hydroxy group or carboxy group such as acrylic acid, 2-allylphenol, etc. It may be suitably used as the acid-modified oligomer, and also effectively forms the crosslinked triazine structure to make the formation and provision of the DFSR showing excellent heat resistance reliability possible.

Meanwhile, the resin composition according to one embodiment may further include the conventionally known acid-modified oligomer in addition to the above-mentioned iminocarbonate-based compound. For the expression of excellent developing property, heat resistance reliability, etc. according to one embodiment, the iminocarbonate-based compound of the acid-modified oligomer may be contained in an amount of about 5 to 25% by weight, or about 7 to 20% by weight, or about 9 to 15% by weight, based on the total weight of the resin composition, and the remaining part among the total content of the acid-modified oligomer as described below may be the additional acid-modified oligomer.

The additional acid-modified oligomer is an oligomer having a carboxy group and a photo-curable functional group, for example, a photo-curable functional group having an unsaturated double bond or an acrylate group and a carboxy group in the molecule, and any previously known component may be used in the resin composition for forming a DFSR with no limitation. For example, the backbone of such additional acid-modified oligomer may be novolak epoxy, polyurethane, etc., and the component wherein the carboxy group, the acrylate group, etc. are introduced to such a backbone may be used as the additional acid-modified oligomer. The photo-curable functional group may preferably be an acrylate group, wherein the acid-modified oligomer may be obtained as an oligomer form by copolymerizing the polymerizable monomer having a carboxy group and the monomer including an acrylate-based compound, etc.

More specifically, the examples of the additional acid-modified oligomer which can be used in the resin composition are as follows:

(1) a resin-containing carboxy group, obtained by copolymerizing an unsaturated carboxylic acid (a) such as (meth)acrylic acid, etc. and a compound (b) having an unsaturated double bond such as styrene, α-methylstyrene, a lower alkyl (meth)acrylate, iso-butylene, etc.;

(2) a photo-sensitive resin-containing carboxy group, obtained by reacting a compound having an ethylenically unsaturated group such as a vinyl group, an allyl group, a (meth)acryloyl group, etc. and a reactive group such as an epoxy group, acid chloride, etc., for example, glycidyl (meth)acrylate, with the part of the copolymer of the unsaturated carboxylic acid (a) and the compound (b) having an unsaturated double bond, and further adding an ethylenically unsaturated group thereto as a pendant;

(3) a photo-sensitive resin-containing carboxy group, obtained by reacting the unsaturated carboxylic acid (a) with the copolymer of a compound (c) having an epoxy group and an unsaturated double bond such as glycidyl (meth)acrylate, α-methylglycidyl(meth)acrylate, etc. and the compound (b) having unsaturated double bond, and further reacting the secondary hydroxy group thus formed with a saturated or unsaturated polybasic acid anhydride (d) such as phthalic anhydride, tetrahydrophthalic anhydride, hexahydrophthalic anhydride, etc.;

(4) a photo-sensitive resin-containing carboxy group, obtained by reacting a compound (f) having one hydroxy group and one or more ethylenically unsaturated double bonds such as hydroxyalkyl(meth)acrylate, etc. with the copolymer of an acid hydride (e) having an unsaturated double bond such as maleic anhydride, itaconic anhydride, etc. and the compound (b) having an unsaturated double bond;

(5) a photo-sensitive compound containing a carboxy group, obtained by carrying out an esterification reaction (whole esterification or partial esterification, preferably whole esterification) between epoxy groups of a multifunctional epoxy compound (g) having two or more epoxy groups in the molecule, as disclosed below, or a multifunctional epoxy resin obtained by further epoxidating a hydroxy group of the multifunctional epoxy compound with epichlorohydrin, and carboxy groups of an unsaturated monocarboxylic acid (h) such as (meth)acrylic acid, etc., and further reacting the hydroxy group thus obtained with the saturated or unsaturated polybasic acid anhydride (d);

(6) a resin-containing carboxy group, obtained by reacting an organic acid (i) having one carboxy group in one molecule without an ethylenically unsaturated bond such as a $C_2$-$C_{17}$ alkylcarboxylic acid, an alkyl carboxylic acid containing an aromatic group, etc. with the epoxy group of the copolymer of the compound (b) having an unsaturated double bond and glycidyl(meth)acrylate, and further reacting the secondary hydroxy group thus formed with the saturated or unsaturated polybasic acid anhydride (d);

(7) a urethane-resin-containing carboxy group, obtained by a polyaddition reaction of a diisocyanate (j) such as an aliphatic diisocyanate, a branched aliphatic diisocyanate, an alicyclic diisocyanate, an aromatic diisocyanate, etc., a dialcohol compound (k) including a carboxy group such as dimethylol propionic acid, dimethylol butanoic acid, etc., and the diol compound (m) such as a polycarbonate-based polyol, a polyether-based polyol, a polyester-based polyol, a polyolefin-based polyol, an acryl-based polyol, a bisphenol A type alkylene oxide adduct diol, a compound having a phenolic hydroxy group and an alcoholic hydroxy group, etc.;

(8) a photo-sensitive urethane-resin-containing carboxy group, obtained by a polyaddition reaction of the diisocyanate (j), a (meth)acrylate or its partial acid anhydride-modified compound (n) of a bi-functional epoxy resin such as a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a bixylenol-type epoxy resin, a biphenyl-type epoxy resin, etc., the dialcohol compound (k) including a carboxy group, and the diol compound (m);

(9) a urethane-resin-containing carboxy group, obtained by adding the compound (f) having one hydroxy group and one or more ethylenically unsaturated double bonds such as hydroxyalkyl(meth)acrylate, etc. so as to introduce an unsaturated double bond to the ends, during the reaction process of said (7) or (8);

(10) a urethane-resin-containing carboxy group, obtained by adding a compound including one isocyanate group and one or more (meth)acryloyl groups to the molecule prepared by an equimolar reaction of isophorone diisocyanate and pentaerythritol triacrylate, and (meth)acrylating the ends, during the reaction process of said (7) or (8);

(11) a photo-sensitive resin-containing carboxy group, obtained by reacting the saturated or unsaturated polybasic acid anhydride (d) with the primary hydroxy group of a modified oxetane compound which is obtained by reacting the unsaturated monocarboxylic acid (h) with a multi-functional oxetane compound having two or more oxetane rings in the molecule, as disclosed below;

(12) a photo-sensitive resin-containing carboxy group, obtained by introducing an unsaturated double bond to the reaction product of a bisepoxy compound and a bisphenol compound, and successively reacting the saturated or unsaturated polybasic acid anhydride (d) with the same; and

(13) a photo-sensitive resin-containing carboxy group, obtained by reacting the saturated or unsaturated polybasic acid anhydride (d) with the reaction product obtained by reacting the unsaturated monocarboxylic acid (h) with the reaction product of a novolak-type phenol resin, an alkylene oxide such as ethylene oxide, propylene oxide, butylene oxide, trimethylene oxide, tetrahydrofuran, tetrahydropyran, etc., and/or a cyclic carbonate such as ethylene carbonate, propylene carbonate, butylene carbonate, 2,3-carbonate propylmethacrylate, etc.

Among said components, the acid-modified oligomer preferable in the point of flexibility of the DFSR can be obtained in the case that the compounds having isocyanate group used for synthesizing the resins of (7) to (10) do not include benzene ring, and in the case that the multi-functional and the bi-functional epoxy resins used for synthesizing the resins of (5) and (8) are linear compounds having a bisphenol A backbone, bisphenol F backbone, bisphenyl backbone, or bixylenol backbone, or hydrogenated compounds thereof. Furthermore, on the other aspect, the modified resins of (7) to (10) have a urethane bond in their main chain and may be preferable at the point of bending.

Furthermore, a commercially available component may be used as the additional acid-modified oligomer, and ZAR-2000, CCR-1235, ZFR-1122, CCR-1291H, etc. (Nippon Kayaku Co., Ltd.) may be mentioned as specific examples thereof.

Meanwhile, the acid-modified oligomer may be contained in the amount of about 15 to 75% by weight, or about 20 to 50% by weight, or about 25 to 45% by weight, based on the total weight of the resin composition according to one embodiment. When the content of the acid-modified oligomer is too low, the developing property of the resin composition declines and the strength of the DFSR may deteriorate. On the contrary, when the content of the acid-modified oligomer is too high, the resin composition is excessively developed and the uniformity during coating may decline.

Furthermore, the acid value of the acid-modified oligomer may be about 40 to 120 mgKOH/g, or about 50 to 110 mgKOH/g, or about 60 to 90 mgKOH/g. When the acid value is excessively low, the alkali developing property may deteriorate, and when it is too high, it may be difficult to form a normal DFSR pattern because even the photo-cured part, for example, the exposure part, can be dissolved by the developing solution.

Photo-polymerizable Monomer

The resin composition according to one embodiment includes a photo-polymerizable monomer. The photo-polymerizable monomer may be a compound having a photo-curable unsaturated functional group, for example, two or more multi-functional vinyl groups, etc., and it may form crosslinks with the unsaturated functional group of the above-mentioned acid-modified oligomer to form a crosslinked structure due to the photo-curing upon exposure to light. Thereby, the resin composition of the exposure part corresponding to the part on which the DFSR is formed may not be alkali-developed and remain on the board.

A photo-polymerizable monomer which is liquid phase at room temperature may be used, and thereby the viscosity of the resin composition of one embodiment may be controlled depending on the application method, or the alkali-developing property in the non-exposure part may be more improved.

As the photo-polymerizable monomer, acrylate-based compounds having two or more photo-curable unsaturated functional groups, for example, one or more compounds selected from the group consisting of acrylate compounds having a hydroxy group such as 2-hydroxyethyl acrylate, 2-hydroxypropyl acrylate, pentaerythritol triacrylate, dipentaerythritol pentaacrylate, etc.; water soluble acrylate compounds such as polyethylene glycol diacrylate, polypropylene glycol diacrylate, etc.; multi-functional polyester acrylate compounds of polyhydric alcohols such as trimethylolpropane triacrylate, pentaerythritol tetraacrylate, dipentaerythritol hexaacrylate, etc.; acrylate compounds of ethylene oxide adducts and/or propylene oxide adducts of polyfunctional alcohols such as trimethylolpropane, hydrogenated bisphenol A, etc., or polyphenols such as bisphenol A, biphenol, etc.; polyfunctional or monofunctional polyurethane acrylate compounds which are isocyanate-modified compounds of said acrylates having a hydroxy group; epoxy acrylate compounds which are (meth)acrylic acid adducts of bisphenol A diglycidyl ether, hydrogenated bisphenol A diglycidyl ether, or phenol novolak epoxy resin; and photo-sensitive (meth)acrylate compounds of caprolactone-modified acrylate compounds such as caprolactone-modified ditrimethylolpropane tetraacrylate, ε-caprolactone-modified dipentaerythritol acrylate, caprolactone-modified hydroxypivalic acid neopentylglycol ester diacrylate, etc., and methacrylate compounds corresponding to said acrylate compounds may be used, and said compounds may be used alone or as a mixture of two or more.

Among these compounds, the polyfunctional (meth)acrylate compounds having two or more (meth)acryloyl groups in one molecule may be preferably used as the photo-polymerizable monomer, and particularly, pentaerythritol triacrylate, trimethylolpropane triacrylate, dipentaerythritol hexaacrylate, caprolactone-modified ditrimethylolpropane tetraacrylate, etc. may be suitably used. Furthermore, as the photo-polymerizable monomer that is commercially available, DPEA-12 (Kayarad Co., Ltd.), etc. may be mentioned.

The content of the photo-polymerizable monomer may be about 5 to 30% by weight, or about 7 to 20% by weight, or about 7 to 15% by weight, based on the total weight of the resin composition. When the content of the photo-polymerizable monomer is too low, the photo-curing may not be sufficient, and when the content is too high, the drying property of the DFSR becomes poor and the properties may deteriorate.

Photo-initiator

The resin composition of one embodiment includes a photo-initiator. This photo-initiator plays a role, for example, of initiating the radical photo-curing between the acid-modified oligomer and photo-polymerizable monomer at the exposure part of the resin composition.

As the photo-initiator, known compounds may be used, and benzoin and alkyl ethers thereof such as benzoin, benzoin methyl ether, benzoin ethyl ether, etc.; acetophenones such as acetophenone, 2,2-dimethoxy-2-phenyl acetophenone, 1,1-dichloroacetophenone, 4-(1-t-butyldioxy-1-methylethyl)acetophenone, etc.; anthraquinones such as 2-methylanthraquinone, 2-amylanthraquinone, 2-t-butylanthraquinone, 1-chloroanthraquinone, etc.; thioxanthones such as 2,4-dimethylthioxanthone, 2,4-diisopropylthioxanthone, 2-chlorothioxanthone, etc.; ketals such as acetophenone dimethyl ketal, benzyl dimethyl ketal, etc.; benzophenones such as benzophenone, 4-(1-t-butyldioxy-1-methylethyl)benzophenone, 3,3',4,4'-tetrakis(t-butyldioxycarbonyl)benzophenone, etc. may be used.

Furthermore, α-aminoacetophenones such as 2-methyl-1-[4-(methylthio)phenyl]-2-morpholinopropanone-1,2-benzyl-2-dimethylamino-1-(4-morpholinophenyl)-butan-1-one, 2-(dimethylamino)-2-[(4-methylphenyl)methyl]-1-[4-(4-morpholinyl)phenyl]-1-butanone, N,N-dimethylaminoacetophenone (Irgacure® 907, Irgacure® 369, Irgacure® 379, etc. of Chiba Speciality Chemical Co., Ltd. (present Chiba Japan Co., Ltd.) as commercialized products); and acylphosphine oxides such as 2,4,6-trimethylbenzoyl diphenyl phosphine oxide, bis(2,4,6-trimethylbenzoyl)-phenyl phosphine oxide, bis(2,6-dimethoxybenzoyl)-2,4,4-trimethyl-pentyl phosphine oxide (Lucirin® TPO of BASF Co., Ltd., Irgacure® 819 of Chiba Speciality Chemical Co., Ltd., etc. as commercialized products) may be mentioned as the preferable photo-initiator.

Furthermore, oxime esters may be used as the preferable photo-initiator. 2-(acetyloxyiminomethyl)thioxanten-9-one, 1,2-octandione, 1-[4-(phenylthio)phenyl]-, 2-(O-benzoyloxime), ethanone, 1-[9-ethyl-6-(2-methylbenzoyl)-9H-carbazol-3-yl]-, 1-(O-acetyloxime)), etc. may be mentioned as the specific examples of the oxime esters. As the products on the market, GGI-325, Irgacure® OXE01 and Irgacure® OXE02 of Chiba Speciality Chemical Co., Ltd., N-1919 of ADEKA Co., Ltd., and Darocur TPO of Chiba Speciality Chemical Co., Ltd. may be mentioned.

The photo-initiator may be used in an amount of about 0.5 to 20% by weight, or about 1 to 10% by weight, or about 1 to 5% by weight, based on the total weight of the resin composition. When the content of the photo-initiator is too low, the photo-curing may not properly occur, and when it is too high, the resolution of the resin composition deteriorates or the reliability of the DFSR may be insufficient.

Thermo-curable Binder

The resin composition of one embodiment also includes a thermo-curable binder having a thermo-curable functional group, for example, one or more functional groups selected from an epoxy group, a oxetanyl group, a cyclic ether group, and a cyclic thioether group. The thermo-curable binder can guarantee the heat-resistance and the mechanical properties of the DFSR by forming crosslinks with the acid-modified oligomer, etc. through the thermo-curing process.

The softening point of such thermo-curable binder may be about 70 to 100° C., through which the unevenness during lamination may be minimized. When the softening point is too low, tackiness of the DFSR increases, and when it is too high, the flowability may be poor.

As the thermo-curable binder, a resin including two or more cyclic ether groups and/or cyclic thioether groups ("cyclic (thio)ether group" below) in the molecule may be used, and a bi-functional epoxy resin may also be used. In addition thereto, a diisocyanate or its bi-functional block isocyanate may also be used.

The thermo-curable binder including two or more cyclic (thio)ether groups in the molecule may be the compound having two or more groups, which are any one or two selected from 3-, 4-, or 5-membered cyclic ether groups and cyclic thioether groups in the molecule. Furthermore, the thermo-curable binder may be a polyfunctional epoxy compound including two or more epoxy groups in the molecule, a polyfunctional oxetane compound including two or more oxetanyl groups in the molecule, an episulfide resin including two or more thioether groups in the molecule, etc.

As a specific example of the polyfunctional epoxy compound, a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a novolak-type epoxy resin, a phenol novolak-type epoxy resin, a cresol novolak-type epoxy resin, an N-glycidyl-type epoxy resin, a novolak-type epoxy resin of bisphenol A, a bixylenol-type epoxy resin, a biphenol-type epoxy resin, a chelate-type epoxy resin, a glyoxal-type epoxy resin, an epoxy resin including amino groups, a rubber-modified epoxy resin, a dicyclopentadiene phenolic-type epoxy resin, a diglycidyl phthalate resin, a heterocyclic epoxy resin, a tetraglycidyl xylenoyl ethane resin, a silicone-modified epoxy resin, and a ε-caprolactone-modified epoxy resin, etc., may be mentioned. Furthermore, those of which phosphorus atoms, etc. are introduced to the structure may also be used for giving flame retardancy. Such epoxy resins improve the adhering property, the soldering heat-resistance, the resistance to electroless plating, etc. of the cured film by being thermo-cured.

As the polyfunctional oxetane compound, an etherification product of an oxetane alcohol and a resin having a hydroxy group such as novolak resin, poly(p-hydroxystyrene), cardo-type bisphenols, calixarenes, calixresorcinarenes, silsesquioxanes, etc. may be mentioned, in addition to polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and an oligomer or copolymer thereof. In addition, a copolymer of an unsaturated monomer having an oxetane ring and an alkyl(meth)acrylate may be mentioned.

As the compound having two or more cyclic thioether groups in the molecule, for example, a bisphenol A-type episulfide resin YL7000 produced by Japan Epoxy Resin Co., Ltd. may be mentioned. Furthermore, an episulfide resin which is obtained by replacing an oxygen atom of the epoxy group of the novolak-type epoxy resin by a sulfur atom may also be used.

Furthermore, as a commercially available compound, YDCN-500-80P of Kukdo Chemical Co., Ltd., may be used.

The thermo-curable binder may be included in the content corresponding to about 0.8 to 2.0 eq. per 1 eq. of the carboxy group of the acid-modified oligomer. When the content of the thermo-curable binder is too low, the carboxy group remains in the DFSR even after curing, and the heat-resistance, the alkali-resistance, the electrical insulating property, etc. may deteriorate. On the contrary, when the content is too high, it is not preferable because the cyclic (thio)ether group of a low molecular weight remains in the dried film to deteriorate the strength of the film.

Besides said components, the resin composition of one embodiment may further include a solvent, and one or more selected from the group consisting of a thermo-curable binder catalyst, a filler, a pigment, and an additive, disclosed below.

Thermo-curable Binder Catalyst

The thermo-curable binder catalyst plays a role of accelerating the thermo-curing of the thermo-curable binder.

As the thermo-curable binder catalyst, for example, imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, etc.; amine compounds such as dicyandiamide, benzyldimethylamine, 4-(dimethylamino)-N,N-dimethylbenzylamine, 4-methoxy-N,N-dimethylbenzylamine, 4-methyl-N,N-dimethylbenzylamine, etc.; hydrazine compounds such as adipic acid dihydrazide, sebacic acid dihydrazide, etc.; and phosphorus compounds such as triphenylphosphine, etc. may be mentioned. Furthermore, as the catalysts on sale, there are 2MZ-A, 2MZ-OK, 2PHZ, 2P4BHZ, and 2P4 MHZ (product names of imidazole-based compounds) produced by Sikoku Kasei Kogyo Co., Ltd., U-CAT3503N and UCAT3502T (product names of block isocyanate compounds of dimethylamine), and DBU, DBN, U-CATSA102, and U-CAT5002 (bicyclic amidine compounds and their salts) produced by San Apro Co., Ltd. However, the catalyst is not limited to these, and may also be a thermo-curing catalyst for the epoxy resins or the oxetane compounds, or a compound accelerating the reaction of the epoxy group and/or the oxetanyl group with the carboxy group. The catalyst may be used alone or as a mixture of two or more. Furthermore, S-triazine derivatives such as guanamine, acetoguanamine, benzoguanamine, melamine, 2,4-diamino-6-methacryloyloxyethyl-S-triazine, 2-vinyl-4,6-diamino-S-triazine, a 2-vinyl-4,6-diamino-S-triazine•isocyanuric acid adduct, a 2,4-diamino-6-methacryloyloxyethyl-S-triazine.isocyanuric acid adduct, etc. may be used. Preferably, a compound which can function as a tackifier may be used in combination with the thermo-curable binder catalyst.

The content of the thermo-curable binder catalyst may be about 0.3 to 15% by weight based on the total weight of the resin composition, in an aspect of proper thermo-curing property.

Filler

The filler plays a role of improving the heat-resistant stability, the dimensional stability to heat, and the adhesive strength of the resin. It also acts as a body pigment by reinforcing the color.

As the filler, inorganic or organic fillers, for example, barium sulfate, barium titanate, amorphous silica, crystalline silica, fused silica, spherical silica, talc, clay, magnesium carbonate, calcium carbonate, aluminum oxide (alumina), aluminum hydroxide, mica, etc. may be used.

The content of the filler is preferably about 5 to 50% by weight based on the total weight of the composition. When the filler is used over 50% by weight, it is not preferable because the viscosity of the composition becomes high and the coatability may deteriorate or the curing degree declines.

Pigment

The pigment plays a role of hiding defects such as scratches of the circuit lines by providing visibility and hiding power.

As the pigment, red, blue, green, yellow, and black pigments may be used. As the blue pigment, phthalocyanine blue, pigment blue 15:1, pigment blue 15:2, pigment blue 15:3, pigment blue 15:4, pigment blue 15:6, pigment blue 60, etc. may be used. As the green pigment, pigment green 7, pigment green 36, solvent green 3, solvent green 5, solvent green 20, solvent green 28, etc. may be used. As the yellow pigment, anthraquinone-based compounds, isoindolinone-based compounds, condensed azo-based compounds, benzimidazolone-based compounds, etc., for example, pigment yellow 108, pigment yellow 147, pigment yellow 151, pigment yellow 166, pigment yellow 181, pigment yellow 193, etc. may be used.

The content of the pigment is preferably about 0.5 to 3% by weight based on the total weight of the resin composition. When the pigment is used in the amount of less than 0.5% by weight, the visibility and hiding power decline, and when the pigment is used in the amount of over 3% by weight, the heat-resistance declines.

Additive

The additive may be included for eliminating bubbles from the resin composition, eliminating popping or craters on the surface of the film during a coating process, giving flame retardancy, and controlling the viscosity, and may also be included as a catalyst.

Specifically, well-known conventional additives, for example, a well-known conventional thickening agent such as microsilica powder, organic bentonite, montmorillonite, etc.; an antifoaming agent and/or a leveling agent such as a silicon-based compound, a fluorine-based compound, a polymeric compound, etc.; a silane coupling agent such as an imidazole-based compound, a thiazole-based compound, a triazole-based compound, etc.; and a flame retardant such as a phosphorus-based flame retardant, an antimony-based flame retardant, etc. may be combined.

Among them, the leveling agent plays a role of eliminating popping or craters on the surface of the film during a coating process. As an example thereof, BYK-380N, BYK-307, BYK-378, BYK-350, etc. produced by BYK-Chemie GmbH may be used.

The content of the additive is preferably about 0.01 to 10% by weight based on the total weight of the resin composition.

Solvent

One or more solvents may be used together for dissolving the resin composition or giving proper viscosity thereto.

As the solvent, ketones such as methylethylketone, cyclohexanone, etc.; aromatic hydrocarbons such as toluene, xylene, tetramethylbenzene, etc.; glycol ethers (cellosolves) such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, triethylene glycol monoethyl ether, etc.; acetic acid esters such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, dipropylene glycol monomethyl ether acetate, etc.; alcohols such as ethanol, propanol, ethylene glycol, propylene glycol, carbitol, etc.; aliphatic hydrocarbons such as octane, decane, etc.; petroleum-based solvents such as petroleum ether, petroleum naphtha, hydrogenated petroleum naphtha, solvent naphtha, etc.; and amides such as dimethyl acetamide, dimethyl formamide (DMF), etc. may be mentioned. These solvents may be used alone or as a mixture of two or more.

The content of the solvent may be about 10 to 50% by weight based on the total weight of the resin composition. When the content of the solvent is less than 10% by weight, the viscosity is too high and the coatability declines, and when the content is over 50% by weight, the drying property becomes bad to increase the stickiness.

On the other hand, according to another embodiment of the present invention, there may be provided a dry film solder resist which includes a cured product of an acid-modified oligomer including an iminocarbonate-based compound having a carboxy group (—COOH) and a photo-curable unsaturated functional group; a photo-polymerizable monomer having two or more photo-curable unsaturated functional groups; and a thermo-curable binder having a thermo-curable functional group.

[Dry Film Solder Resist]

The process of preparing the dry film solder resist (DFSR) by using the photo-curable and thermo-curable resin composition according to one embodiment is briefly explained as follows.

First, the resin composition according to one embodiment is coated as a photo-sensitive coating material on a carrier film with a comma coater, a blade coater, a lip coater, a rod coater, a squeeze coater, a reverse coater, a transfer roll coater, a gravure coater, or a spray coater, etc., and dried by passing the film through an oven at 50 to 130° C. for 1 to 30 minutes, and then a release film is laminated thereon so as to prepare a dry film composed of a carrier film, a photo-sensitive film, and a release film sequentially from the bottom.

The thickness of the photo-sensitive film may be about 5 to 100 μm. At this time, plastic films such as a polyethylene terephthalate (PET) film, a polyester film, a polyimide film, a polyamideimide film, a polypropylene film, a polystyrene film, etc. may be used as the carrier film, and a polyethylene (PE) film, a polytetrafluoroethylene film, a polypropylene film, surface treated paper, etc. may be used as the release film. It is preferable that the adhering force between the photo-sensitive film and the release film is lower than the adhering force between the photo-sensitive film and the carrier film when the release film is stripped.

Next, after peeling away the release film, the photo-sensitive film layer is adhered to a board on which a circuit is formed by using a vacuum laminater, a hot-roll laminater, a vacuum press, etc.

Then, the substrate is exposed to light having a certain wavelength range (UV, etc.). The substrate may be exposed selectively by using a photo-mask, or pattern-exposed directly by using a laser direct exposure device. The carrier film is stripped after the exposure. The light exposure may be different depending on the thickness of the film, and is preferably 0 to 1000 mJ/cm$^2$. When the light exposure is progressed, for example, photo-curing occurs at the exposure part to form crosslinks between the unsaturated functional groups contained in the acid-modified oligomer (e.g., the above-stated iminocarbonate-based compound), the photo-polymerizable monomer, etc., and consequently the exposure part remains unremoved after the developing process. On the other hand, the above crosslinks and the subsequent crosslinked structure are not formed in the non-exposure part, and the carboxy group is kept as it is, and thus it is possible to be alkali-developed.

After this, the substrate is developed by using an alkali solution. As the alkali solution, an aqueous alkali solution including potassium hydroxide, sodium hydroxide, sodium carbonate, potassium carbonate, sodium phosphate, sodium silicate, ammonia, amines, etc. may be used. According to the development, only the exposure part of the film can remain.

Finally, the printed circuit board including the solder resist formed from the photo-sensitive film is completed by thermo-curing (post curing) the same. At this time, it is preferable that the thermo-curing temperature is 100° C. or more.

According to said method, the DFSR and the printed circuit board including the same can be provided. Since the DFSR is prepared by photo-curing and thermo-curing of the resin composition, the DFSR may include a cured product of an acid-modified oligomer including an iminocarbonate-based compound having a carboxy group (—COOH) and a photo-curable unsaturated functional group, a photo-polymerizable monomer having two or more photo-curable unsaturated functional groups, and a thermo-curable binder having a thermo-curable functional group.

More specifically, the cured product may include a crosslinked structure produced by thermo-curing of the carboxy group of the iminocarbonate-based compound and the thermo-curable functional group; a crosslinked structure produced by photo-curing of the unsaturated functional groups of the iminocarbonate-based compound and the photo-polymerizable monomer with each other; and a crosslinked triazine structure of Formula (2) derived from the iminocarbonate-based compound. In particular, since the above cured product includes the crosslinked triazine structure derived from the iminocarbonate-based compound, the DFSR may show the higher glass transition temperature of about 130 to 180° C., for example, about 140 to 170° C., or about 150° C., and more improved heat resistance reliability. Thus, the DFSR can satisfy various physical properties such as excellent PCT tolerance, TCT heat resistance, HAST tolerance to fine wiring, etc. that are required for the package board materials of semiconductor devices, and can be advantageously used as the package board materials of semiconductor devices.

In addition, the DFSR may further include a small quantity of a photo-initiator, which remains after the photo-curing process, dispersed in the cured product.

Specifically, the dry film solder resist may have the thermal expansion coefficient ($\alpha 1$) of 10 to 35 ppm, preferably 20 ppm or lower, before the glass transition temperature (Tg), and the thermal expansion coefficient ($\alpha 2$) of 150 ppm or lower, or 120 ppm or lower, preferably 50 to 100 ppm, after the glass transition temperature (Tg).

Hereinafter, the present invention is explained in more detail in the following examples. However, the following examples are only for illustrating the present invention and the scope of the present invention is not limited by them.

EXAMPLES AND COMPARATIVE EXAMPLES

Preparation of Resin Composition, Dry Film, and Printed Circuit Board

Example 1

The iminocarbonate compound as the acid-modified oligomer was prepared by reacting a cyanate group of the bisphenol-based cyanate ester compound BA-230 from Lonza Co., Ltd. with acrylic acid and 1,2,3,6-tetrahydrophthalic acid (4-cyclohexene-1,2-dicarboxylic acid) in the molar ratio of 1:1.

The resin composition was prepared by mixing 10% by weight of the above iminocarbonate-based compound, 25% by weight of ZAR-2000 (Nippon Kayaku Co., Ltd.) as the additional acid-modified oligomer, 5% by weight of DPHA (SK Cytec Co., Ltd.) as the photo-polymerizable monomer, 2% by weight of TPO as the photo-initiator, 15% by weight of YDCN-500-80P (Nippon Kayaku Co., Ltd.) as the thermo-curable binder, 0.4% by weight of 2-PI as the thermo-curable binder catalyst, 23% by weight of the filler $BaSO_4$, 0.3% by weight of the pigment phthalocyanine blue, 0.3% by weight of the additive BYK-110 and 19% by weight of the solvent DMF.

A dry film composed of a carrier film, a photo-sensitive film (thickness of 20 μm), and a release film sequentially from the bottom was prepared by applying the resin composition thus prepared on a PET film (a carrier film), drying the same by passing it through an oven at 75° C. and laminating a PE film (a release film) thereon.

After the cover film of the prepared dry film was peeled off, the photo-sensitive film layer was vacuum laminated on the board on which the circuit was formed, and the photomask corresponding to the circuit pattern was placed on the photo-sensitive film layer, which was then exposed to UV. The exposure was performed under UV light of a 365 nm wavelength at 350 $mJ/cm^2$. Subsequently, the PET film was removed, and the unnecessary part was also removed by developing for a certain period of time in a 1 weight % $Na_2CO_3$ alkali solution at 31° C. to form the desired pattern. Then, the photo-curing was performed at 1000 $mJ/cm^2$, and finally the thermo-curing was performed for 1 h at 160 to 170° C. to give a printed circuit board including the protective film (solder resist) formed from the photo-sensitive film.

Examples 2 and 3

Dry films and printed circuit boards were prepared according to the same procedure as Example 1, except that 5% by weight (Example 2) or 15% by weight (Example 3) of the iminocarbonate-based compound was used and the content of solvent was increased or decreased depending on the content of the iminocarbonate-based compound.

Examples 4 to 6

Dry films and printed circuit boards were prepared according to the same procedure as Example 1, except that 5% by weight each of T-1420 (Nippon Kayaku Co., Ltd.; Example 4), DPCA-60 (Nippon Kayaku Co., Ltd.; Example 5), or R-684 (Nippon Kayaku Co., Ltd.; Example 6) was used as the photo-polymerizable monomer instead of 5% by weight of DPHA (SK Cytec Co., Ltd.).

The specific composition of the resin compositions of Examples 1 to 6 may be summarized in the following Table 1.

TABLE 1

| Functions | Component (Product Name) | Ex. 1 | Ex. 2 | Ex. 3 | Ex. 4 | Ex. 5 | Ex. 6 |
|---|---|---|---|---|---|---|---|
| Acid-modified Oligomer | Iminocarbonate-based | 10 | 5 | 15 | 10 | 10 | 10 |
|  | ZAR-2000 | 25 | 25 | 25 | 25 | 25 | 25 |
| Photo-polymerizable monomer | DPHA | 5 | 5 | 5 |  |  |  |
|  | T-1420 |  |  |  | 5 |  |  |
|  | DPCA-60 |  |  |  |  | 5 |  |
|  | R-684 |  |  |  |  |  | 5 |
| Thermo-curable binder | YDCN-500-80P | 15 | 15 | 15 | 15 | 15 | 15 |
| Photo-initiator | TPO | 2 | 2 | 2 | 2 | 2 | 2 |
| Catalyst | 2-PI | 0.4 | 0.4 | 0.4 | 0.4 | 0.4 | 0.4 |
| Filler | $BaSO_4$ | 23 | 23 | 23 | 23 | 23 | 23 |
| Pigment | Phthalocyanine blue | 0.3 | 0.3 | 0.3 | 0.3 | 0.3 | 0.3 |
| Additive | BYK-110 | 0.3 | 0.3 | 0.3 | 0.3 | 0.3 | 0.3 |
| Solvent | DMF | 19 | 24 | 14 | 19 | 19 | 19 |
| Total | Unit: % by weight | 100 | 100 | 100 | 100 | 100 | 100 |

Comparative Examples 1 to 3

Dry films and printed circuit boards were prepared according to the same procedure as Example 1, except that the iminocarbonate compound was not used and ZAR-2000 (Comparative Example 1), CCR-1235 (Comparative Example 2), or ZFR-1122 (Comparative Example 3), each of which was from Nippon Kayaku Co., Ltd, was used in the content of 35% by weight as the acid-modified oligomer.

Comparative Example 4

A dry film and a printed circuit board were prepared according to the same procedure as Example 1, except that DPHA (SK Cytec Co., Ltd.) was not used as the photopolymerizable monomer.

Comparative Example 5

A dry film and a printed circuit board were prepared according to the same procedure as Example 1, except that the thermo-curable binder was not used.

The specific composition of the resin compositions of Comparative Examples 1 to 5 may be summarized in the following Table 2.

TABLE 2

| Functions | Component (or Product Name) | Com. Ex. 1 | Com. Ex. 2 | Com. Ex. 3 | Com. Ex. 4 | Com. Ex. 5 |
|---|---|---|---|---|---|---|
| Acid-modified oligomer | Iminocarbonate-based | | | | 10 | 10 |
| | ZAR-2000 | 35 | | | 25 | 25 |
| | CCR-1235 | | 35 | | | |
| | ZFR-1122 | | | 35 | | |
| Photo-polymerizable monomer | DPHA | 5 | 5 | 5 | — | 5 |
| Thermo-curable binder | YDCN-500-80P | 15 | 15 | 15 | 15 | — |
| Photo-initiator | TPO | 2 | 2 | 2 | 2 | 2 |
| Catalyst | 2-PI | 0.4 | 0.4 | 0.4 | 0.4 | 0.4 |
| Filler | BaSO$_4$ | 23 | 23 | 23 | 23 | 23 |
| Pigment | Phthalocyanine blue | 0.3 | 0.3 | 0.3 | 0.3 | 0.3 |
| Additive | BYK-110 | 0.3 | 0.3 | 0.3 | 0.3 | 0.3 |
| Solvent | DMF | 19 | 19 | 19 | 24 | 34 |
| Total | Unit: % by weight | 100 | 100 | 100 | 100 | 100 |

Test Example

The dry films and printed circuit boards prepared in the examples and comparative examples were tested as follows.

Test Example 1

PCT Heat Resistance and Resistance to Electroless Nickel Plating

A copper clad laminate, LG-T-500GA, of LG Chemical Co., Ltd. having a thickness of 0.1 mm and copper thickness of 12 μm was cut into length and breadth of 5 cm×5 cm, and micro-roughness was formed on the copper surface by chemical etching. A specimen was prepared by peeling off the release film from the dry film prepared in the examples and comparative examples, vacuum laminating the film layer on the copper clad laminate (board) wherein the roughness was formed on the surface by using a vacuum laminator MV LP-500 (Meiki Seisakusho Co., Ltd.), exposing the same to UV light of a 365 nm wavelength at 350 mJ/cm$^2$, eliminating the PET film, dipping the same in a 1 weight % Na$_2$CO$_3$ alkali solution at 31° C. for a certain period of time for development, and photo-curing the same at about 1000 mJ/cm$^2$. Finally, it was subjected to thermo-curing at about 170° C. for 1 hour.

This specimen was treated by using a PCT apparatus (Asppec Co., Ltd., HAST System TPC-412MD) for 192 h under a temperature of 121° C., humidity of 100% saturated, and pressure of 2 atm, and then the state of the film was observed. The result of observation was assessed according to the following criteria.

1: There is no stripping, popping, or color change of DFSR.
2: There is stripping, popping, or color change of DFSR, but not as severe as the following 3.
3: There are severe stripping, popping, and color change of DFSR.

Then, the resistance to electroless nickel plating was evaluated by treating the above specimen in the electroless nickel plating solution (ELN-M, ELN-A of Poongwon Chemical Co., Ltd.) at a temperature of 85° C. for 30 min and by observing the state of the film.

1: There is no whitening of DFSR.
2: There is some whitening of DFSR, but not as severe as the following 3.
3: There is severe whitening of DFSR.

Test Example 2

Tg and Thermal Expansion Coefficient

The film layer was laminated on a 12 μm shiny copper surface of 3EC-M3-VLP of Mitsui Metal Co., Ltd. in the same manner as the preparation of the specimen for measuring the PCT heat resistance. A DFSR specimen was prepared by carrying out the same process as the preparation of the specimen for measuring the PCT heat resistance until the thermo-curing step, except that a negative-type mask to which a stripe pattern having a width of 5 mm and an interval of 5 mm was drawn was put on the specimen and that the specimen was exposed to light. Finally, copper cladding was stripped from the specimen to give a specimen in the shape of a 5 mm stripe for evaluating TMA (thermal mechanical analysis, METTLER TOLEDO, TMA/SDTA 840).

The glass transition temperature (Tg) was measured as follows. First, the specimen was installed in a holder to have the length of 10 mm. The length of how much the specimen was elongated was measured while providing the force of 0.05 N to both ends of the specimen and elevating the temperature by 10° C./min from 50° C. to 250° C. The inflection point shown in the temperature raising section was referred to as Tg, and Tg was evaluated according to the following criteria:

1: Tg of 150° C. or higher;
2: Tg of 140° C. or higher and lower than 150° C.;
3: Tg of 120° C. or higher and lower than 140° C.;
4: Tg of 100° C. or higher and lower than 120° C.; and
5: Tg of lower than 100° C.

The coefficient of thermal expansion (CTE) which was simultaneously acquired during Tg measurement was measured and compared. First, the thermal expansion coefficient α1 at a temperature lower than the glass transition temperature was obtained as the slope of the elongated specimen from 50° C. to 80° C., and the thermal expansion coefficient α2 at a temperature higher than the glass transition temperature was obtained as the slope of the elongated specimen from 170° C. to 210° C. The results were evaluated according to the following criteria:

(Coefficient of Thermal Expansion α1)
1: α1 of lower than 20 ppm;
2: α1 of 20 ppm or higher and lower than 30 ppm;
3: α1 of 30 ppm or higher and lower than 50 ppm; and
4: α1 of 50 ppm or higher.

(Coefficient of Thermal Expansion α2)
1: α2 of lower than 100 ppm;
2: α2 of 100 ppm or higher and lower than 120 ppm;
3: α2 of 120 ppm or higher and lower than 150 ppm;
4: α2 of 150 ppm or higher and lower than 200 ppm; and
5: α2 of 200 ppm or higher.

Test Example 3

Evaluation of Developing Property

A copper clad laminate, 3EC-M3-VLP, of Mitsui Metal Co., Ltd. having thickness of 12 μm was cut into length and breadth of 5 cm×5 cm, and micro-roughness was formed on the copper surface by chemical etching. A specimen was prepared by peeling off the release film from the dry film prepared in the examples and comparative examples, and vacuum laminating the film layer on the copper clad laminate (board) wherein the roughness was formed on the surface by using a vacuum laminator MV LP-500 (Meiki Seisakusho Co., Ltd.).

After a negative-type photomask having a hole shape of an 80 μm diameter was then adhered thereto and exposed to UV light of a 365 nm wavelength at 350 mJ/cm$^2$. Then, the PET film was eliminated and the specimen was developed for a certain period of time in a 1 weight % $Na_2CO_3$ alkali solution at 31° C. to form a pattern.

The pattern shape thus formed was observed by SEM and evaluated according to the following criteria.

1: The cross-section is straight, and no film residue remains on the bottom.
2: The cross-section is not straight, and an undercut or overhang exists in the shape of a hole.
3: Observed in the state of not being developed.
4: Pattern formation is impossible due to overdevelopment.

The PCT heat resistance, resistance to electroless nickel plating, Tg, coefficient of thermal expansion, and developing property which were measured and evaluated in the above Test Examples 1 to 3 are summarized in the following Table 3.

TABLE 3

Results of Test Examples 1 to 3

| | Ex. 1 | Ex. 2 | Ex. 3 | Ex. 4 | Ex. 5 | Ex. 6 | Com. Ex. 1 | Com. Ex. 2 | Com. Ex. 3 | Com. Ex. 4 | Com. Ex. 5 |
|---|---|---|---|---|---|---|---|---|---|---|---|
| Tg | 1 | 3 | 2 | 1 | 1 | 1 | 4 | 4 | 5 | 5 | 5 |
| α1 | 1 | 2 | 2 | 1 | 2 | 2 | 3 | 4 | 3 | 3 | 4 |
| α2 | 1 | 3 | 2 | 1 | 3 | 2 | 4 | 3 | 4 | 5 | 5 |
| Developing property | 1 | 1 | 3 | 2 | 1 | 1 | 2 | 2 | 1 | 4 | 1 |
| PCT heat resistance | 1 | 2 | 1 | 1 | 1 | 1 | 1 | 1 | 1 | 3 | 3 |
| Resistance to plating | 1 | 1 | 1 | 1 | 1 | 1 | 1 | 1 | 1 | 3 | 3 |

As shown in the results of measurement and evaluation of Table 3 above, the DFSRs of the examples have been identified as showing excellent physical properties compared with those of the comparative examples in various aspects of PCT heat resistance, glass transition temperature, coefficient of thermal expansion, etc., as well as developing property. Therefore, it has been confirmed that the examples are more appropriate for the formation of DFSR showing the heat resistance reliability at a high temperature.

What is claimed is:

1. A photo-curable and thermo-curable resin composition, comprising:
    an acid-modified oligomer comprising an iminocarbonate-based compound having a carboxy group (—COOH) and a photo-curable unsaturated functional group;
    a photo-polymerizable monomer having two or more photo-curable unsaturated functional groups;
    a thermo-curable binder having a thermo-curable functional group; and
    a photo-initiator,
    wherein the acid-modified oligomer comprises an iminocarbonate-based compound having the following Formula (1):

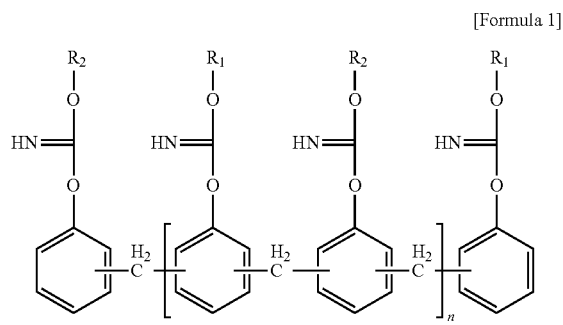

[Formula 1]

wherein, in the above Formula (1), n is an integer of 1 to 100, R1 is a functional group derived from the compound having a photo-curable unsaturated functional group and a hydroxy group or carboxy group, and R2 is a functional group derived from the dicarboxylic acid compound.

2. The resin composition of claim 1 which, when cured, has a coefficient of thermal expansion (α1) of 10 to 35 ppm before a glass transition temperature (Tg) and a coefficient of thermal expansion (α2) of 150 ppm or lower after the glass transition temperature (Tg).

3. The photo-curable and thermo-curable resin composition of claim 1 wherein the iminocarbonate-based compound is formed by reacting a cyanate ester-based compound, a dicarboxylic acid compound, and a compound having a photo-curable unsaturated functional group and a hydroxy group or carboxy group.

4. The resin composition of claim 3 wherein the dicarboxylic acid compound is an aliphatic dicarboxylic acid compound, an alicyclic dicarboxylic acid compound, or an aromatic dicarboxylic acid compound.

5. The photo-curable and thermo-curable resin composition of claim 3, wherein the dicarboxylic acid compound is one or more compounds selected from the group consisting of oxalic acid, malonic acid, succinic acid, glutaric acid, adipic acid, pimelic acid, suberic acid, azelaic acid, sebacic acid, norbornene dicarboxylic acid, a C5-C10 cycloalkane dicarboxylic acid, and acid anhydrides thereof.

6. The photo-curable and thermo-curable resin composition of claim 3 which comprises, as the dicarboxylic acid compound, one or more compounds selected from the group consisting of phthalic acid, norbornene dicarboxylic acid, tetrahydrophthalic acid, succinic acid, imidazole dicarboxylic acid, pyridine dicarboxylic acid, and acid anhydrides thereof.

7. The photo-curable and thermo-curable resin composition of claim 3 wherein the compound having a photo-curable unsaturated functional group and a hydroxy group or carboxy group comprises one or more compounds selected from the group consisting of acrylic acid, methacrylic acid, cinnamic acid, butenoic acid, hexenoic acid, 2-allylphenol, hydroxystyrene, hydroxycyclohexane, and 5-hydroxyl-p-naphthoquinone.

8. The photo-curable and thermo-curable resin composition of claim 3 wherein the cyanate ester-based compound includes the bisphenol-based or novolak-based compound having a cyanide group (—OCN).

9. The photo-curable and thermo-curable resin composition of claim 3, wherein the dicarboxylic acid compound and the compound having a photo-curable unsaturated functional group and a hydroxy group or carboxy group are used in a molar ratio of 2:8 to 8:2 to be reacted with the cyanate ester-based compound.

10. The photo-curable and thermo-curable resin composition of claim 1, wherein $R_1$ of Formula (1) is

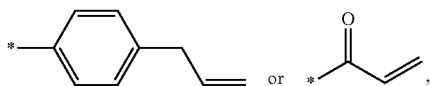

$R_2$ is

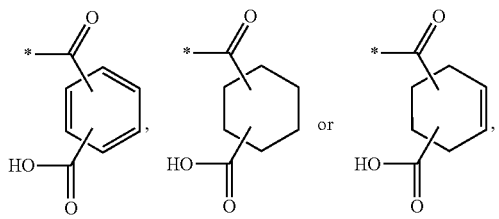

and said '*' means a point of binding.

11. The photo-curable and thermo-curable resin composition of claim 1, wherein the acid-modified oligomer is contained in an amount of 15 to 75% by weight based on the total weight of the resin composition.

12. The photo-curable and thermo-curable resin composition of claim 1, wherein the photo-polymerizable monomer comprises an acrylate-based compound having two or more photo-curable unsaturated functional groups.

13. The photo-curable and thermo-curable resin composition of claim 1, wherein the photo-polymerizable monomer comprises one or more compounds selected from the group consisting of acrylate-based compounds having a hydroxy group, water soluble acrylate-based compounds, polyester acrylate-based compounds, polyurethane acrylate-based compounds, epoxy acrylate-based compounds, and caprolactone-modified acrylate-based compounds.

14. The photo-curable and thermo-curable resin composition of claim 1, wherein the photo-polymerizable monomer is contained in an amount of 5 to 30% by weight based on the total weight of the resin composition.

15. The photo-curable and thermo-curable resin composition of claim 1, wherein the photo-initiator comprises one or more selected from the group consisting of benzoins and alkylethers thereof, acetophenones, anthraquinones, thioxanthones, ketals, benzophenones, α-aminoacetophenones, acylphosphine oxides, and oxime esters.

16. The photo-curable and thermo-curable resin composition of claim 1, wherein the photo-initiator is contained in an amount of 0.5 to 20% by weight based on the total weight of the resin composition.

17. The photo-curable and thermo-curable resin composition of claim 1, wherein the thermo-curable functional group is one or more selected from the group consisting of an epoxy group, an oxetanyl group, a cyclic ether group, and a cyclic thioether group.

18. The photo-curable and thermo-curable resin composition of claim 1, wherein the thermo-curable binder is contained in an amount corresponding to 0.8 to 2.0 eq. with respect to 1 eq. of the carboxy group in the acid-modified oligomer.

19. The photo-curable and thermo-curable resin composition of claim 1, which further comprises a solvent, and one or more selected from the group consisting of a thermo-curable binder catalyst, a filler, a pigment, and an additive.

20. A dry film solder resist which comprises a cured product of:
an acid-modified oligomer comprising an iminocarbonate-based compound having a carboxy group (—COOH) and a photo-curable unsaturated functional group;
a photo-polymerizable monomer having two or more photo-curable unsaturated functional groups; and
a thermo-curable binder having a thermo-curable functional group, wherein the acid-modified oligomer comprises an iminocarbonate-based compound having the following Formula (1):

[Formula 1]

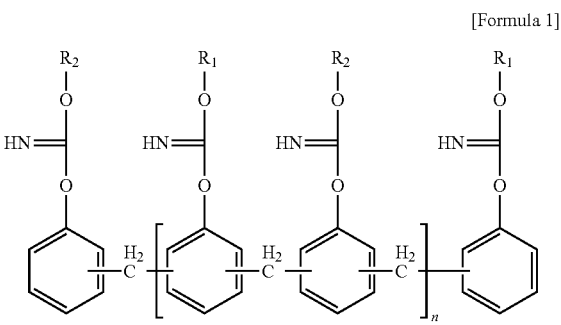

wherein in the above Formula (1), n is an integer of 1 to 100, $R_1$ is a functional group derived from the compound having a photo-curable unsaturated functional group and a hydroxy group or carboxy group, and $R_2$ is a functional group derived from the dicarboxylic acid compound.

21. The dry film solder resist of claim 20, which has a coefficient of thermal expansion (α1) of 10 to 35 ppm before a glass transition temperature (Tg) and a coefficient of thermal expansion (α2) of 150 ppm or lower after the glass transition temperature (Tg).

22. The dry film solder resist of claim 20, wherein the cured product comprises:
a cross-linked structure wherein the carboxy group of the iminocarbonate-based compound and the thermo-curable functional group are crosslinked;
a crosslinked structure wherein the unsaturated functional groups of the iminocarbonate-based compound and the photo-polymerizable monomer are crosslinked with each other; and a crosslinked triazine structure of the following Formula (2) which is derived from the iminocarbonate-based compound:

[Formula 2]

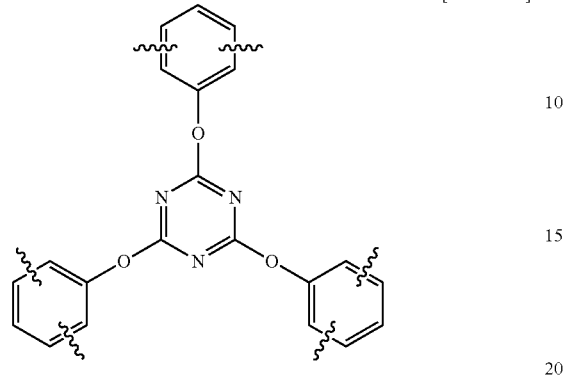

23. The dry film solder resist of claim 20, which further comprises the photo-initiator dispersed in the cured product.

24. The dry film solder resist of claim 20, which has the glass transition temperature (Tg) of 130 to 180° C.

25. The dry film solder resist of claim 20, which is used for preparation of package board of a semiconductor device.

* * * * *